(12) United States Patent
Chen

(10) Patent No.: US 9,066,438 B2
(45) Date of Patent: Jun. 23, 2015

(54) FIXING MECHANISM FOR FIXING AN INTERFACE CARD OF AN ELECTRONIC DEVICE AND ELECTRONIC DEVICE THEREWITH

(71) Applicant: Wistron Corporation, New Taipei (TW)

(72) Inventor: Chun-Yu Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 245 days.

(21) Appl. No.: 13/831,437

(22) Filed: Mar. 14, 2013

(65) Prior Publication Data

US 2014/0146444 A1    May 29, 2014

(30) Foreign Application Priority Data

Nov. 26, 2012 (TW) .............................. 101222902 U

(51) Int. Cl.
| | |
|---|---|
| H05K 5/00 | (2006.01) |
| H05K 1/14 | (2006.01) |
| H05K 7/00 | (2006.01) |
| A47B 96/00 | (2006.01) |
| A47K 1/00 | (2006.01) |
| A47K 5/00 | (2006.01) |
| E04G 5/06 | (2006.01) |
| F16L 3/08 | (2006.01) |
| F21V 21/00 | (2006.01) |
| F21V 35/00 | (2006.01) |
| H05K 7/14 | (2006.01) |

(52) U.S. Cl.
CPC ...................... *H05K 7/1405* (2013.01)

(58) Field of Classification Search
None
See application file for complete search history.

(56) References Cited

U.S. PATENT DOCUMENTS

| | | | | | |
|---|---|---|---|---|---|
| 4,235,502 | A | * | 11/1980 | Marks et al. .................. | 439/557 |
| 4,881,764 | A | * | 11/1989 | Takahashi et al. .............. | 292/13 |
| D312,616 | S | * | 12/1990 | Makita et al. ................ | D13/154 |
| 5,286,217 | A | * | 2/1994 | Liu et al. ...................... | 439/326 |
| RE35,344 | E | * | 10/1996 | Fry et al. ...................... | 439/557 |
| 6,098,938 | A | * | 8/2000 | Tsai .............................. | 248/200 |
| 6,104,614 | A | * | 8/2000 | Chou et al. .................... | 361/704 |
| 6,244,875 | B1 | * | 6/2001 | McHugh et al. ............... | 439/73 |
| 6,304,439 | B1 | * | 10/2001 | Anderson ................ | 361/679.38 |
| 6,418,035 | B1 | * | 7/2002 | Yu ................................ | 361/809 |
| 6,693,800 | B1 | * | 2/2004 | Lin et al. ...................... | 361/759 |
| 6,728,109 | B1 | * | 4/2004 | Wu .............................. | 361/747 |
| 6,950,313 | B1 | * | 9/2005 | Shih ............................. | 361/759 |
| 6,972,370 | B2 | * | 12/2005 | Wang et al. .................. | 174/535 |
| 7,110,253 | B2 | * | 9/2006 | Fan ......................... | 361/679.32 |
| 7,272,016 | B2 | * | 9/2007 | Chang .......................... | 361/801 |
| 7,289,318 | B2 | * | 10/2007 | Hsiao ....................... | 361/679.41 |
| 7,300,299 | B2 | * | 11/2007 | Wang ........................... | 439/326 |
| 7,335,045 | B1 | * | 2/2008 | Liang ........................... | 439/327 |
| 7,391,619 | B1 | * | 6/2008 | Lee .............................. | 361/759 |

(Continued)

*Primary Examiner* — Hoa C Nguyen
*Assistant Examiner* — Xanthia C Cunningham
(74) *Attorney, Agent, or Firm* — Winston Hsu; Scott Margo

(57) ABSTRACT

A fixing mechanism includes a first platform, a first bent portion, a second platform and an engaging portion. The first platform is fixed on a casing of an electronic device. The first bent portion is connected to the first platform. An end of the second platform is connected to the first bent portion. The second platform pivots relative to the first platform via the first bent portion. The engaging portion is disposed on a side of the second platform. The engaging portion is for engaging with an interface card and the casing as the second platform pivots relative to the first platform, so as to fix the interface card on the casing.

19 Claims, 9 Drawing Sheets

(56) References Cited

U.S. PATENT DOCUMENTS

| | | | |
|---|---|---|---|
| 7,402,072 B1 * | 7/2008 | Chen et al. | 439/377 |
| 7,443,666 B2 * | 10/2008 | Huang | 361/679.32 |
| 7,505,286 B2 * | 3/2009 | Brovald et al. | 361/804 |
| 7,864,518 B2 * | 1/2011 | Wu et al. | 361/679.32 |
| 7,938,658 B1 * | 5/2011 | Zeng et al. | 439/160 |
| 8,020,902 B1 * | 9/2011 | Li | 292/80 |
| 8,218,308 B2 * | 7/2012 | Yang | 361/679.32 |
| 8,465,221 B2 * | 6/2013 | Yan et al. | 403/348 |
| 8,888,148 B2 * | 11/2014 | Hsu | 292/80 |
| 2003/0107878 A1 * | 6/2003 | Kaminski | 361/759 |
| 2004/0037048 A1 * | 2/2004 | Liao | 361/726 |
| 2004/0047123 A1 * | 3/2004 | Shih-Tsung | 361/686 |
| 2004/0052063 A1 * | 3/2004 | Megason et al. | 361/801 |
| 2005/0196992 A1 * | 9/2005 | Tanigawa | 439/160 |
| 2005/0265007 A1 * | 12/2005 | Gordon | 361/755 |
| 2006/0262509 A1 * | 11/2006 | Chang | 361/759 |
| 2007/0032116 A1 * | 2/2007 | Liang | 439/326 |
| 2007/0077051 A1 * | 4/2007 | Toor et al. | 396/144 |
| 2008/0132107 A1 * | 6/2008 | Chang | 439/377 |
| 2011/0068240 A1 * | 3/2011 | Yang et al. | 248/221.11 |
| 2011/0147034 A1 * | 6/2011 | Xu et al. | 174/50 |

\* cited by examiner

FIXING MECHANISM FOR FIXING AN INTERFACE CARD OF AN ELECTRONIC DEVICE AND ELECTRONIC DEVICE THEREWITH

BACKGROUND OF THE INVENTION

1. Field of the Invention

The present invention relates to a fixing mechanism and an electronic device, and more specifically, to a fixing mechanism without using screws for fixing interface cards and an electronic device.

2. Description of the Prior Art

A server computer is widely used in large enterprises, such as banks, game companies and technology companies. Most of normal server computers can replace different interface cards or hard drives for different applications, so that it can meet different demands in different industries. In order to facilitate a user to replace different interface cards, a fixing mechanism is disposed on a casing of the server computer for fixing the interface cards. The fixing mechanism usually fixes the interface cards by screws or engagement of a shaft component. However, an assembly procedure of screws is difficult, and the screws are often lost easily. The shaft component occupies more mechanical space, and the shaft component has not enough structural strength so as to damage easily. Therefore, it is an important issue to design a fixing mechanism which not only has easy assembly and enough structure strength but also occupies less mechanical space.

SUMMARY OF THE INVENTION

The present invention is to provide a fixing mechanism without using screws for fixing interface cards and an electronic device to solve above problems.

According to the disclosure, a fixing mechanism includes a first platform, a first bent portion, a second platform and an engaging portion. The first platform is fixed on a casing of an electronic device. The first bent portion is connected to the first platform. An end of the second platform is connected to the first bent portion. The second platform pivots relative to the first platform via the first bent portion. The engaging portion is disposed on a side of the second platform. The engaging portion is for engaging with an interface card and the casing as the second platform pivots relative to the first platform, so as to fix the interface card on the casing.

According to the disclosure, an electronic device comprises a casing and a fixing mechanism. The fixing mechanism is for fixing an interface card on the casing. The fixing mechanism comprises a first platform, a first bent portion, a second platform, and an engaging portion. The first platform is fixed on the casing of the electronic device. The first bent portion is connected to the first platform. An end of the second platform is connected to the first bent portion, and the second platform pivots relative to the first platform via the first bent portion. The engaging portion is disposed on a side of the second platform, and the engaging portion is for engaging with the interface card and the casing as the second platform pivots relative to the first platform, so as to fix the interface card on the casing.

The present invention provides the integrally formed fixing mechanism, and the first platform of the fixing mechanism is fixed on the casing by the fixing portion. After the interface card is installed inside the casing, the second platform and the engaging portion pivot via the first bent portion, so that the engaging portion is engaged with the opening of the interface card and the installing hole of the casing. Therefore, it can achieve a purpose of fixing the interface card without using any screw, so as to solve problems of fixing the interface card with the conventional screws or the conventional shaft component which occupies too much mechanical space and has not enough structural strength.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
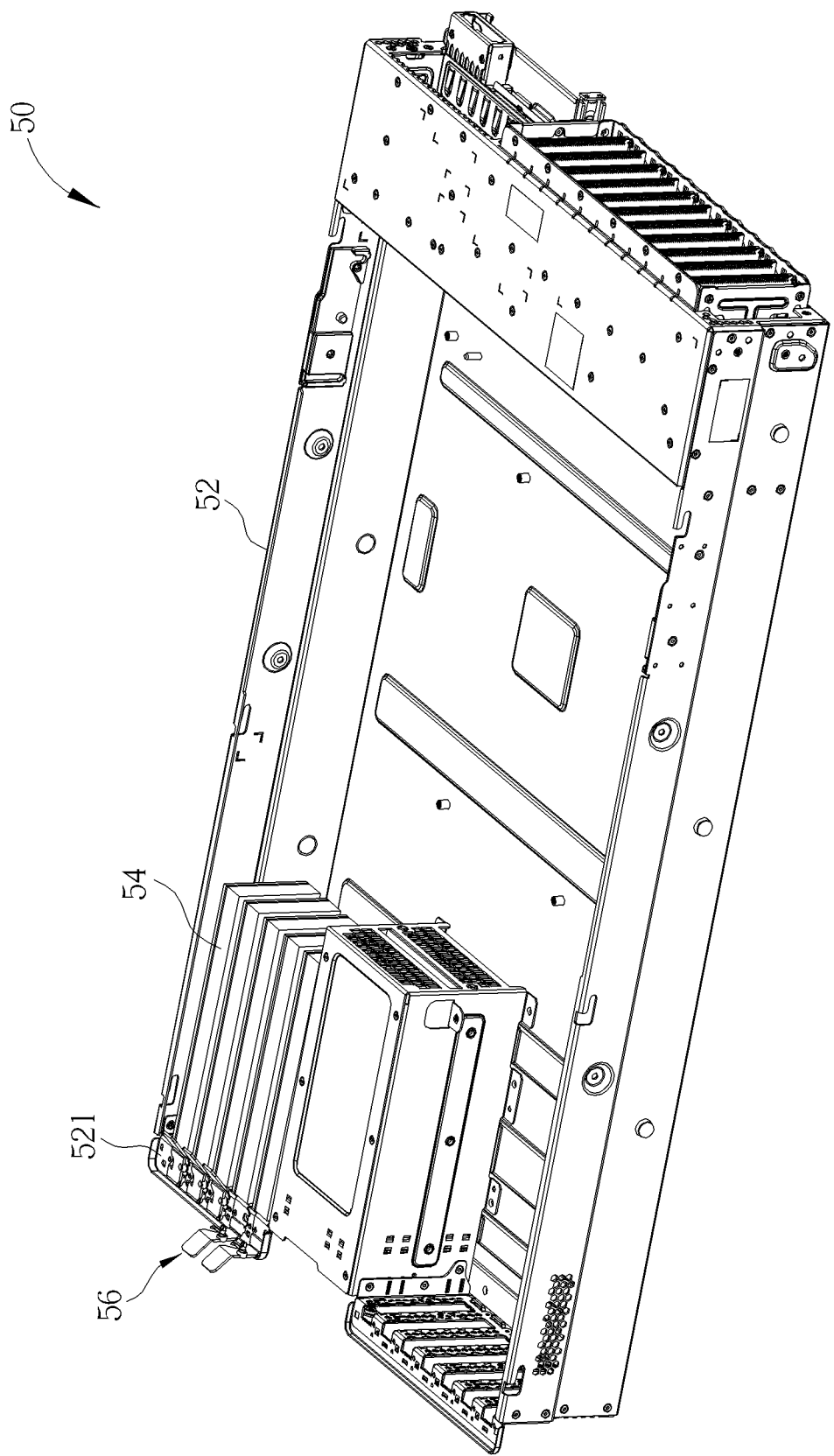
FIG. 1 is an internal diagram of an electronic device according to an embodiment of the present invention.
Figure 2:
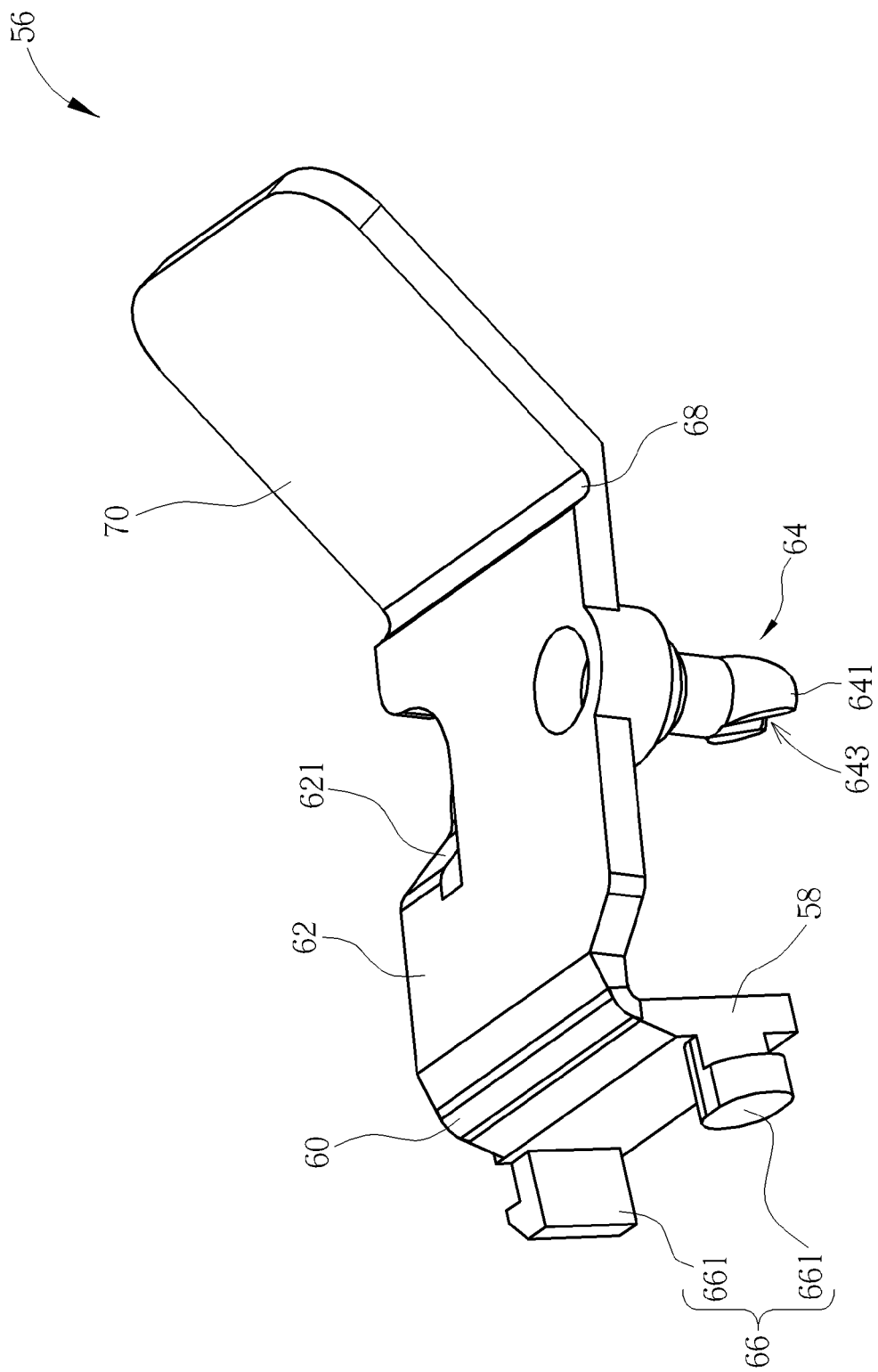
FIG. 2 is a diagram of a fixing mechanism according to the embodiment of the present invention.
Figure 3:
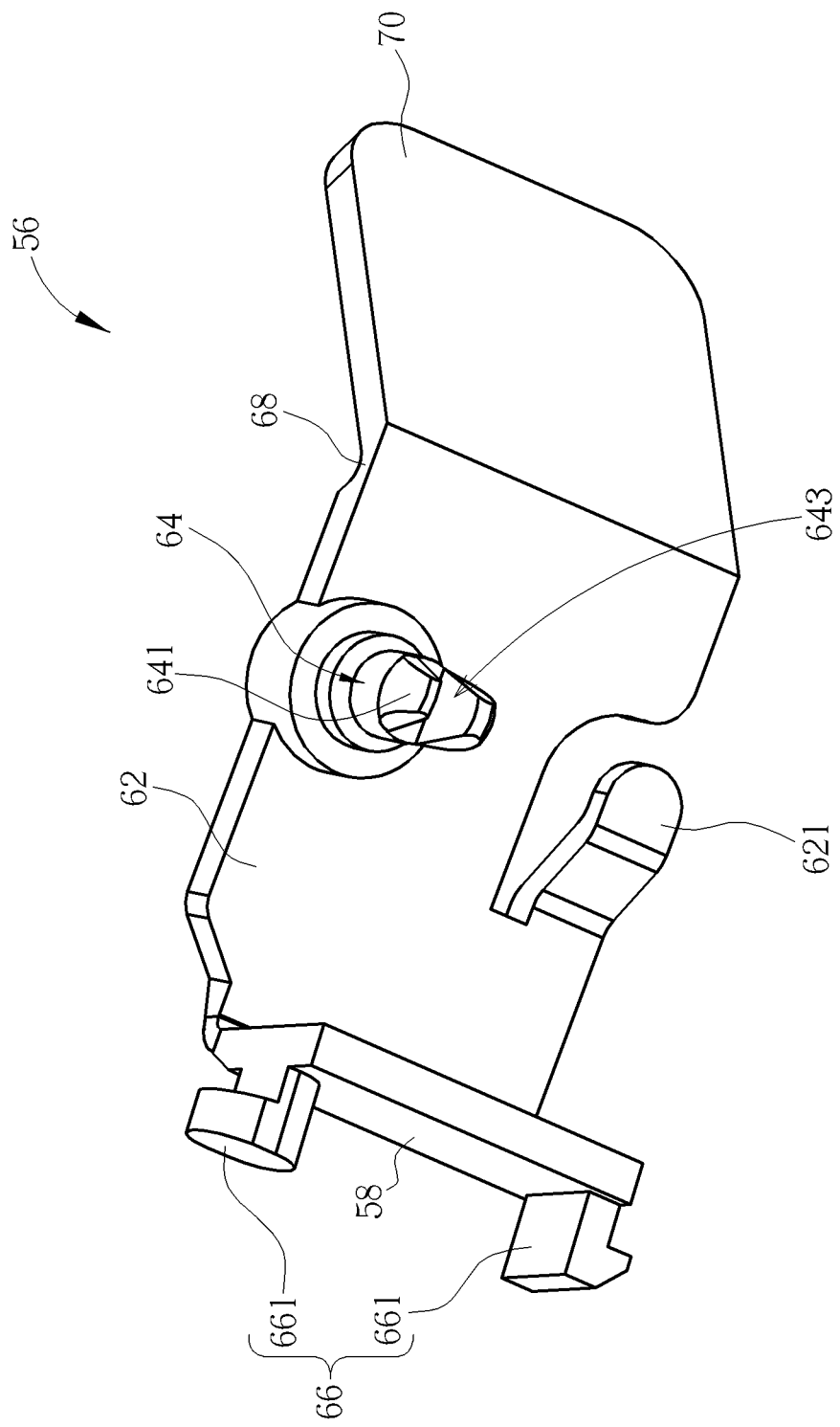
FIG. 3 is an another view of the fixing mechanism according to the embodiment of the present invention.
Figure 4:
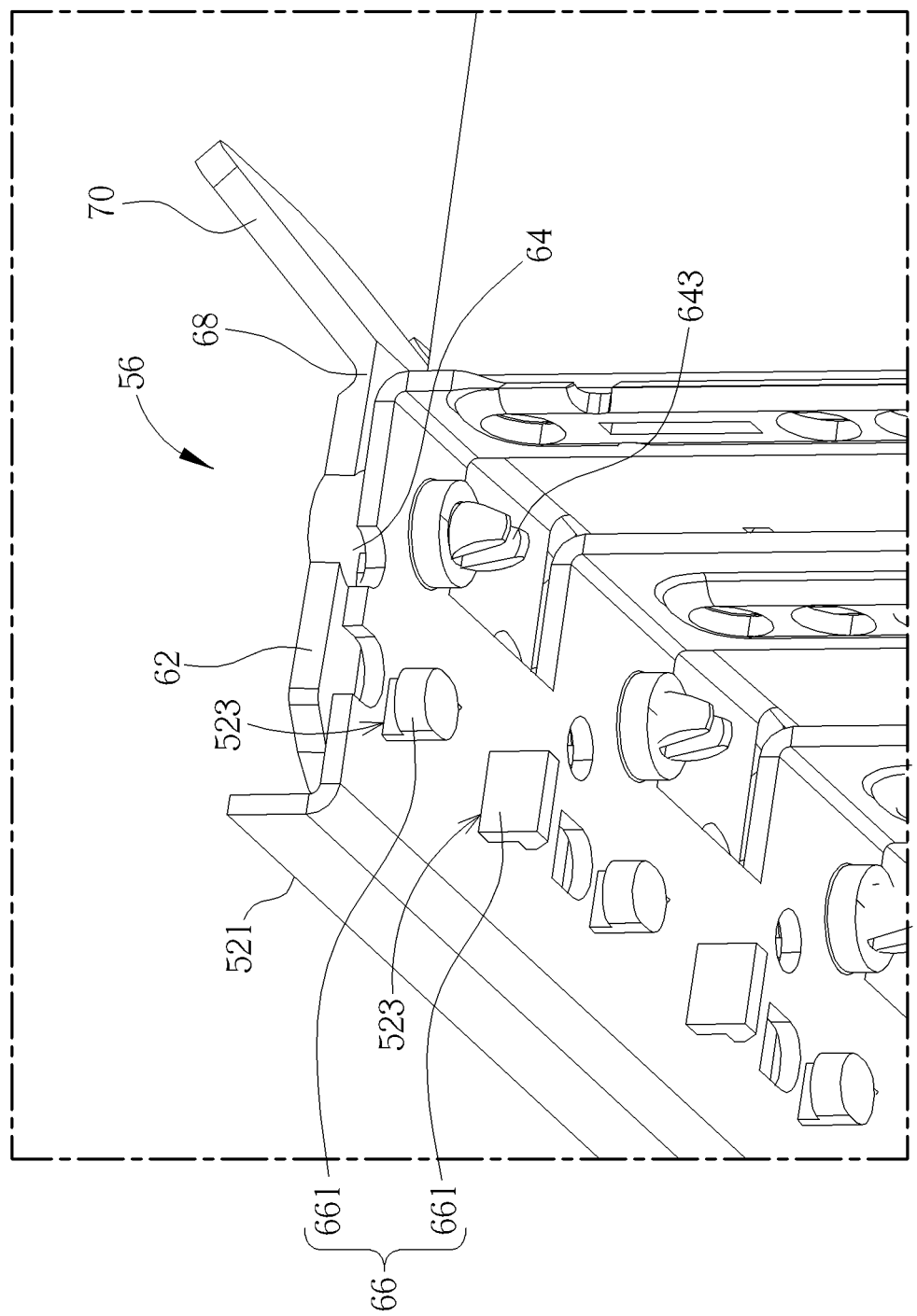
FIG. 4 is a structural diagram of a first platform fixed on a casing according to the embodiment of the present invention.

Please refer to FIG. 1. FIG. 1 is an internal diagram of an electronic device 50 according to an embodiment of the present invention. The electronic device 50 of the present invention can be a desktop computer or a business sever computer. The electronic device 50 includes a casing 52 and at least one fixing mechanism 56. An interface card 54 can be installed inside the electronic device 50. The interface card 54 is a circuit board with an extension function, such as a graphic card, an ethernet interface card, a Universal Serial Bus interface card, and so on. The interface card 54 can be installed inside the casing 52 of the electronic device 50. The fixing mechanism 56 is for fixing the interface card 54 on a rear wall 521 of the casing 52. Please refer to FIG. 2 and FIG. 3. FIG. 2 is a diagram of the fixing mechanism 56 according to the embodiment of the present invention. FIG. 3 is an another view of the fixing mechanism 56 according to the embodiment of the present invention. The fixing mechanism 56 includes a first platform 58, a first bent portion 60, a second platform 62 and an engaging portion 64. The first platform 58 is fixed on the rear wall 521 of the casing 52 of the electronic device 50. The first platform 58 can be fixed on the rear wall 521 in various manners. For example, the first platform 58 can be stuck to the rear wall 521 or be screwed on the rear wall 521 by screws. In this embodiment, the fixing mechanism 56 further includes a fixing portion 66 connected to a bottom of the first platform 58, and the fixing portion 66 is for fixing the first platform 58 on the casing 52 of the electronic device 50. Please refer to FIG. 4. FIG. 4 is a structural diagram of the first platform 58 fixed on the casing 52 according to the embodiment of the present invention. In this embodiment, the fixing mechanism 56 includes two hooking components 661 respectively disposed on two sides of the bottom of the first platform 58, and the two hooking components 661 are for engaging with two holes 523 on the casing 52. Preferably, the first platform 58 of the electronic device 50 can be fixed on the rear wall 521 of the casing 52 in factory, and an end user does not need to install the first platform 58. In addition, the fixing portion 66 and the first platform 58 can be integrally formed.

Please refer to FIG. 1 to FIG. 3. The first bent portion 60 is connected to the first platform 58. An end of the second platform 62 is connected to the first bent portion 60, and the second platform 62 can pivot relative to the first platform 58 via the first bent portion 60. The engaging portion 64 is disposed on a side of the second platform 62, and the engaging portion 64 is for engaging with the interface card 54 and the casing 52 as the second platform 62 pivots relative to the first platform 58, so as to fix the interface card 54 on the casing 52. The fixing mechanism 56 further includes a pressing portion 621 disposed on the side of the second platform 62 for pressing the interface card 54 as the engaging portion 64 is engaged with the interface card 54 and the casing 52, so as to enhance an effect of fixing the interface card 54. In addition, the fixing mechanism 56 further includes a second bent portion 68 and a handle portion 70. The second bent portion 68 is connected to the other end of the second platform 62. The handle portion 70 is connected to the second bent portion 68, and the handle portion 70 can pivot relative to the second platform 62 via the second bent portion 68. The first platform 58, the second platform 62, the first bent portion 60, the second bent portion 68, the engaging portion 64 and the handle portion 70 can be integrally formed and made of resilient material, such as plastic material like Polypropylene, Polyethylene and Nylon. Any resilient material with resilient and flexible properties can be applied to the fixing mechanism 56 of the present invention. It is noticed that thickness of the first bent portion 60 and thickness of the second bent portion 68 can be less than thickness of the first platform 58, thickness of the second platform 62 and thickness of the handle portion 70, respectively. This structural design can reduce bending rigidity of the first bent portion 60 and the second bent portion 68 so as to increase bending flexibility of the first bent portion 60 and the second bent portion 68, so that the second platform 62 can pivot relative to the first platform 58 via the first bent portion 60, and the handle portion 70 can pivot relative the second platform 62 via the second bent portion 68.

Figure 5:
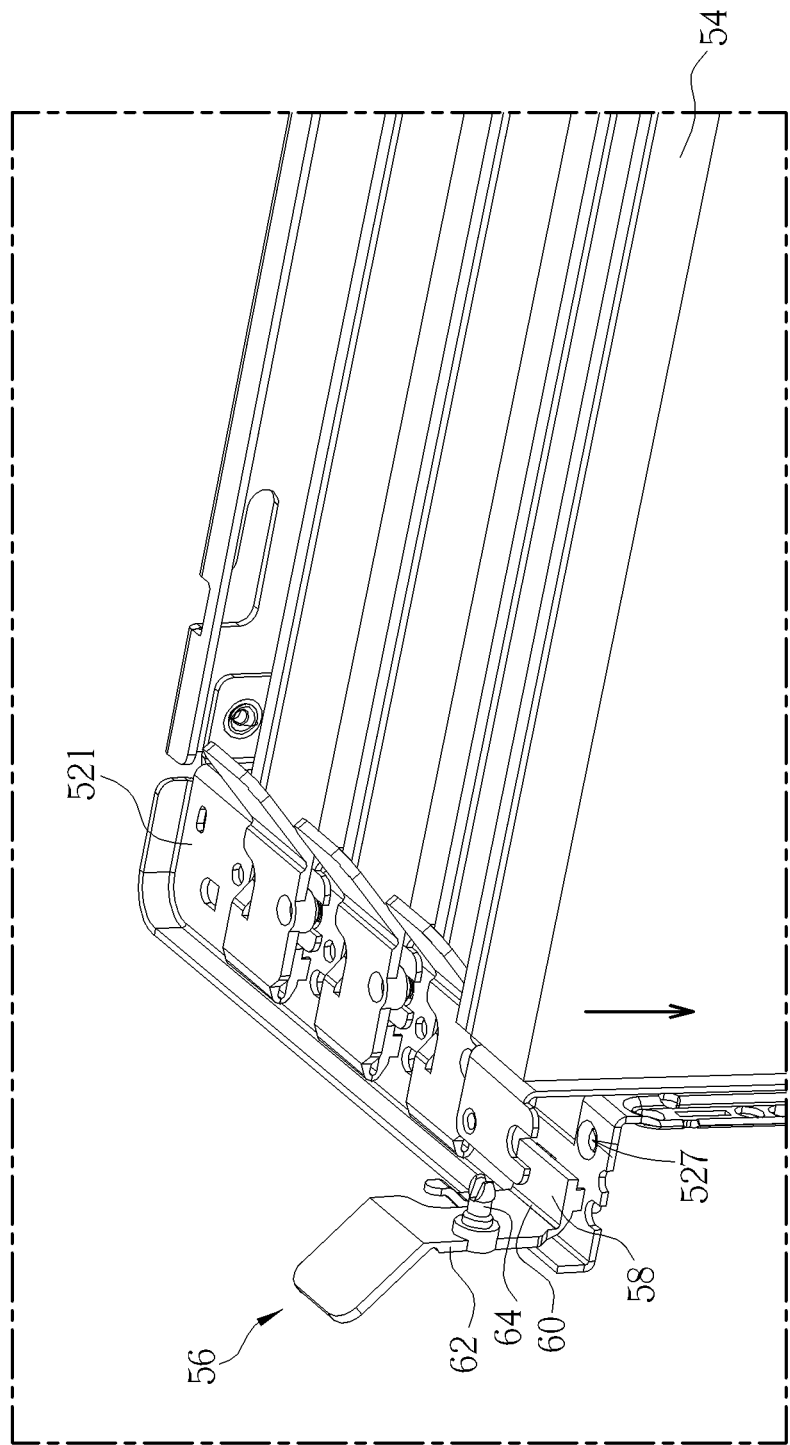
FIG. 5 is a diagram illustrating that an interface card has not been plugged into the casing completely according to the embodiment of the present invention.
Figure 6:
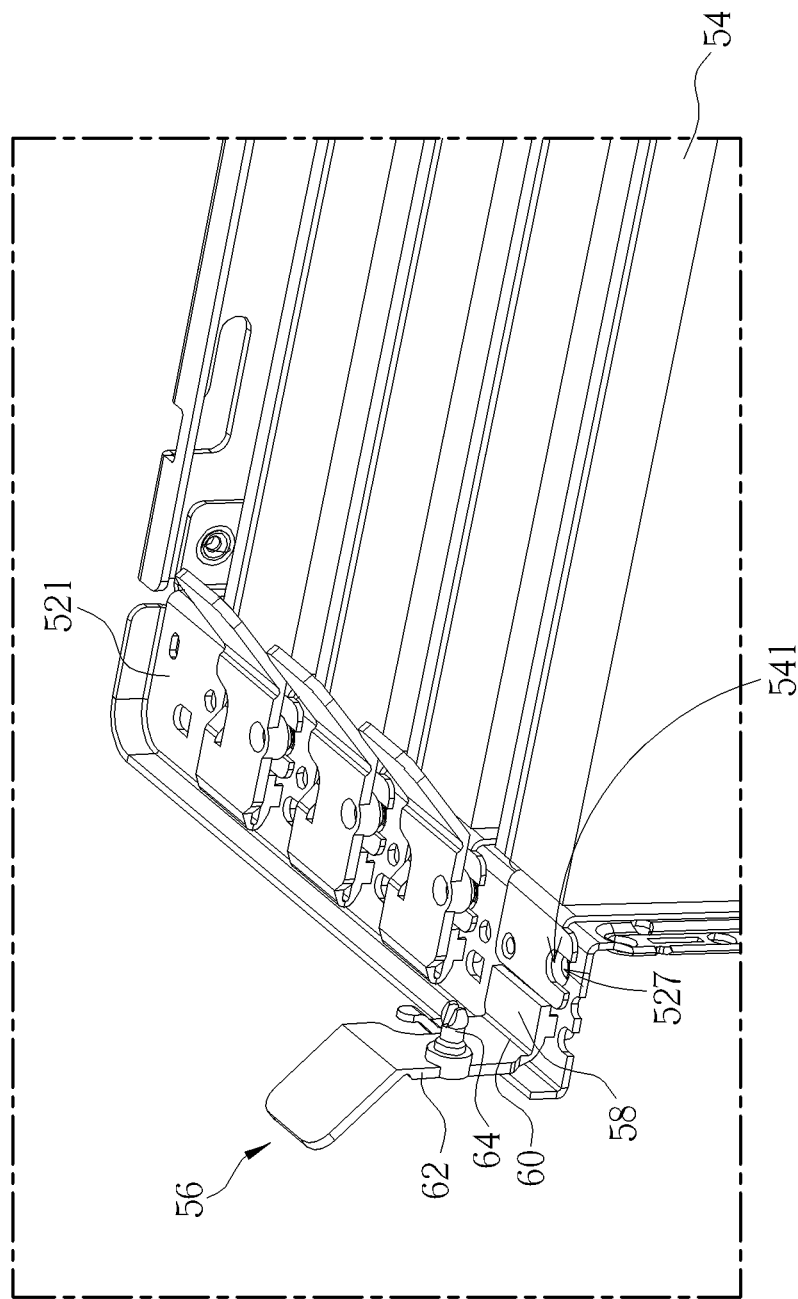
FIG. 6 is a diagram illustrating that the interface card has been plugged into the casing completely according to the embodiment of the present invention.
Figure 7:
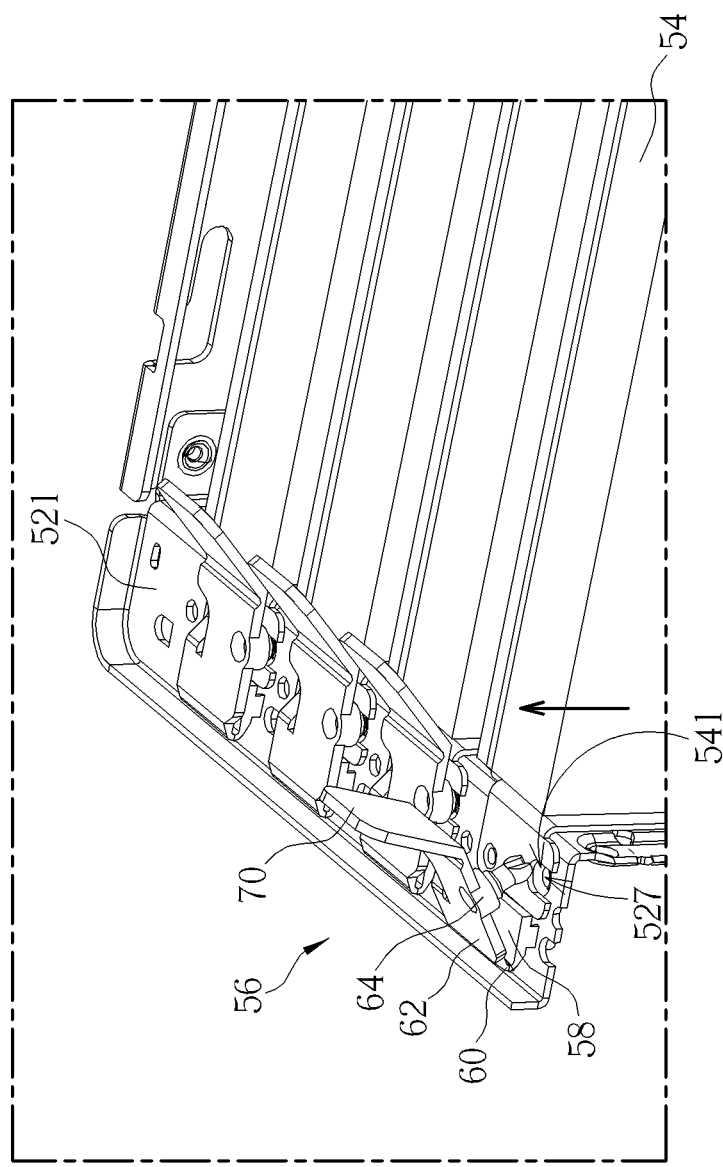
FIG. 7 is a diagram illustrating that the fixing mechanism has not fixed the interface card on the casing according to the embodiment of the present invention.
Figure 8:
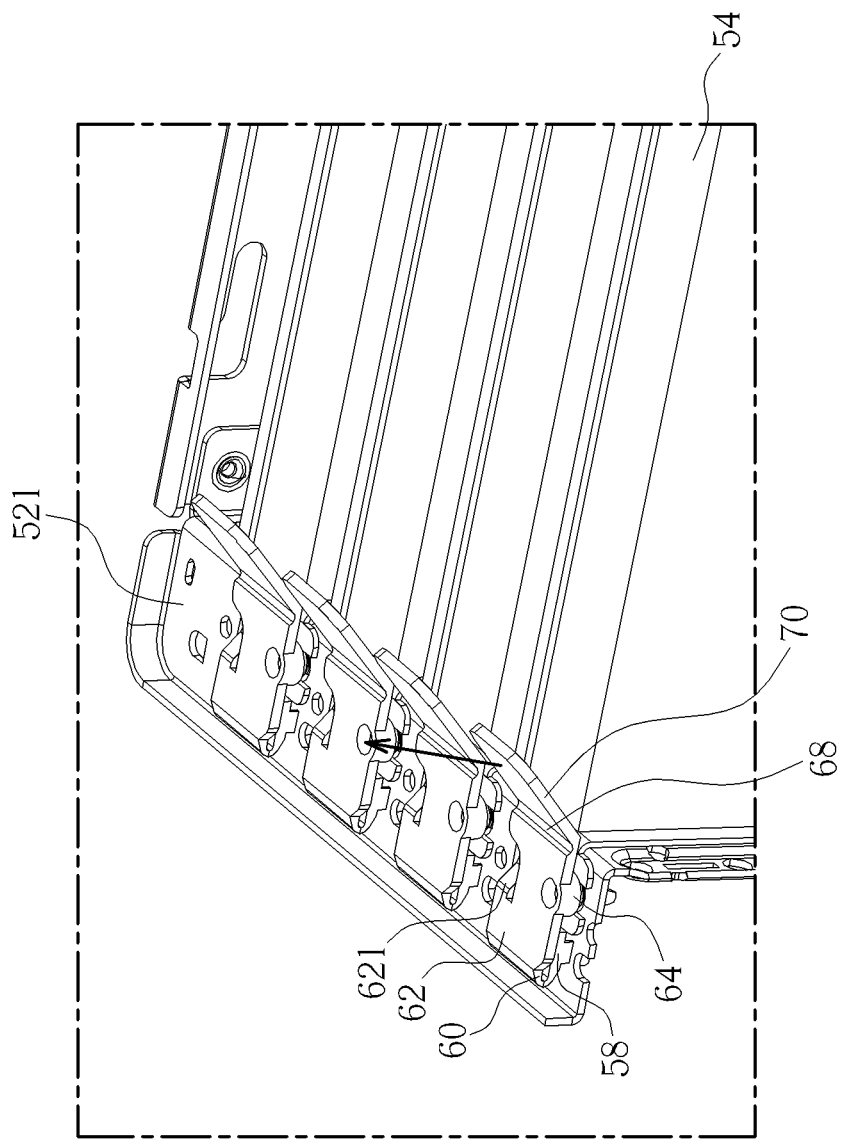
FIG. 8 is a diagram illustrating that the fixing mechanism has fixed the interface card on the casing according to the embodiment of the present invention.
Figure 9:
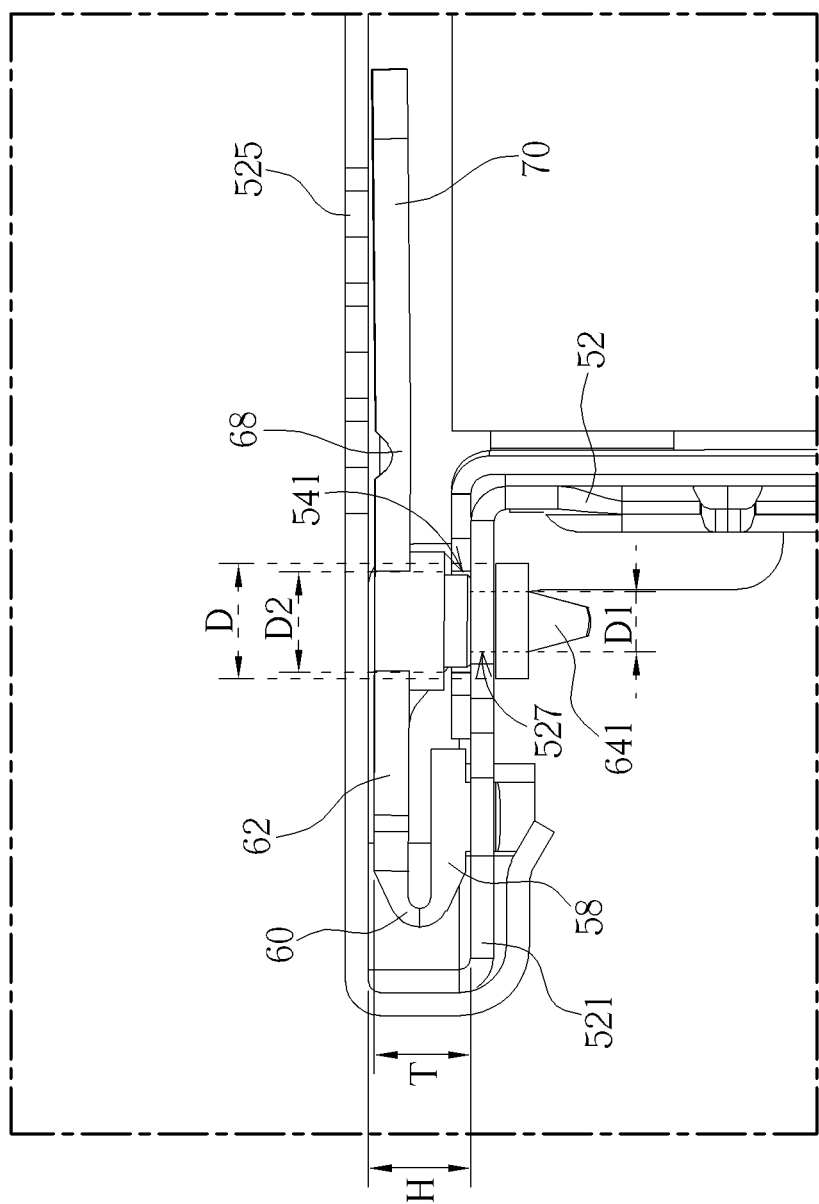
FIG. 9 is a sectional view of the casing covered with a cover according to the embodiment of the present invention.

A procedure of the fixing mechanism 56 for fixing the interface card 54 on the casing 52 is described as follows. Please refer to FIG. 5 to FIG. 9. FIG. 5 is a diagram illustrating that the interface card 54 has not been plugged into the casing 52 completely according to the embodiment of the present invention. FIG. 6 is a diagram illustrating that the interface card 54 has been plugged into the casing 52 completely according to the embodiment of the present invention. FIG. 7 is a diagram illustrating that the fixing mechanism 56 has not fixed the interface card 54 on the casing 52 according to the embodiment of the present invention. FIG. 8 is a diagram illustrating that the fixing mechanism 56 has fixed the interface card 54 on the casing 52 according to the embodiment of the present invention. FIG. 9 is a sectional view of the casing 52 covered with a cover 525 according to the embodiment of the present invention. As the user is desired to install the interface card 54 on the casing 52, the user can move the interface card 54 in an arrow direction shown in FIG. 5 to install on a socket (not shown in figures) on the casing 52. FIG. 6 illustrates that the interface card 54 has been installed on the casing 52. Then, as shown in FIG. 7, the second platform 62 of the fixing mechanism 56 can pivot relative to the first platform 58 via the first bent portion 60, so that the engaging portion 64 is aligned to an opening 541 of the interface card 54 and an installing hole 527 of the casing 52. Then, as shown in FIG. 4 and FIG. 8, the engaging portion 64 can be engaged with the opening 541 and the installing hole 527. As a result, the interface card 54 can be fixed on the casing 52, and the pressing portion 621 presses the interface card 54 at the same time, so that the interface card 54 can be fixed on the casing 52 stably. In addition, the engaging portion 64 can be designed as an opening structure, and corresponding pins can be correspondingly disposed on the interface card 54 and the casing 52, so that the interface card 54 can be fixed on the casing 52 by engagements of the opening structure and the pins.

Please refer to FIG. 2, FIG. 3 and FIG. 9. As shown in FIG. 9, a maximum outer diameter D of the engaging portion 64 can be designed to be greater than a diameter D1 of the installing hole 527 and a diameter D2 of the opening 541. A guiding structure 641 and a slot 643 can be formed on the engaging portion 64. The engaging portion 64 is made of the resilient material, so as to assist the user to engage the engaging portion 64 with the opening 541 of the interface card 54 and the installing hole 527 of the casing 52. That is, the guiding structure 641 is for guiding the engaging portion 64 to engage with the opening 541 of the interface card 54 and the installing hole 527 of the casing 52. The slot 643 is deformed as being pressed inward by the opening 541 and the installing hole 527 when the engaging portion 64 passes through the opening 541 of the interface card 54 and the installing hole 527 of the casing 52, so that the engaging portion 64 can pass through the opening 541 and the installing hole 527 smoothly, and then the interface card 54 is fixed on the casing 52 by the fixing mechanism 56. After the engaging portion 64 passes through the opening 541 and the installing hole 527, the slot 643 is not pressed by the opening 541 and the installing hole 527 and resiliently recovers to an initial condition. Because the maximum outer diameter D is greater than the diameter D1 of the installing hole 527, an end of the engaging portion 64 whereon the slot 643 is disposed contacts against the rear wall 521, so that the engaging portion 64 is not separated from the opening 541 and the installing hole 527. Finally, the casing 52 can be covered with the cover 525, so as to complete assembly procedure. As shown in FIG. 9, because both of the handle portion 70 and the second bent portion 68 are made of resilient material, the handle portion 70 and the second bent portion 68 can be pressed downward and can be substantially parallel to the first platform 58 and the second platform 62. It is noticed that a height H of the rear wall 521 is greater than a total thickness T of the first platform 58, the first bent portion 60 and the second platform 62. In this embodiment, the height H can be 4 mm, and the thickness T can be less than 4 mm. That is, in contrast to the prior art, the fixing mechanism 56 of the present invention needs less mechanical space, so as to solve a problem that a conventional shaft component occupies too much mechanical space in the prior art.

Please refer to FIG. 2, FIG. 3, FIG. 7 to FIG. 9. As it is desired to detach the interface card 54 from the casing 52, the cover 525 on the casing 52 can be detached from the casing 52 first. Next, the handle portion 70 is pulled up in an arrow direction shown in FIG. 8, and the handle portion 70 pivots via the second bent portion 68 to drive the second platform 62 and the engaging portion 64 at this time. As the second platform 62 and the engaging portion 64 move upward, the slot 643 is deformed and pressed by the opening 541 and the installing hole 527, so that the engaging portion 64 can pass through the opening 541 and the installing hole 527. Finally, the second platform 62 keeps pivoting relative to the first platform 58 via the first bent portion 60, so that the engaging portion 64 is separated from the opening 541 and the installing hole 52, as shown in FIG. 7. As a result, the user can replace the interface card 54. It is noticed that a plurality of the interface cards 54 and a plurality of the fixing mechanisms 56 can be installed inside the casing 52, and each fixing mechanism 56 can separately fix the corresponding interface card 54 on the casing 52. Furthermore, each first platform 58 of the fixing mechanisms 56 can be designed to connect with the adjacent first platform 58 in the present invention. That is, each fixing mechanism 56 can be installed on the casing 52 or detached from the casing 52 synchronously, but the engaging portion 64 of each fixing mechanism 56 can be separately fixed on the corresponding interface card 54. Operational principles of this embodiment and the previous embodiment are the same, so further description is omitted herein.

In contrast to the prior art, the present invention provides the integrally formed fixing mechanism, and the first platform of the fixing mechanism is fixed on the casing by the fixing portion. After the interface card is installed inside the casing, the second platform and the engaging portion pivot via the first bent portion, so that the engaging portion is engaged with the opening of the interface card and the installing hole of the casing. Therefore, it can achieve a purpose of fixing the interface card without using any screw, so as to solve problems of fixing the interface card with the conventional screws or the conventional shaft component which occupies too much mechanical space and has not enough structural strength.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism, comprising:
    a first platform fixed on a casing of an electronic device;
    a first bent portion connected to the first platform;
    a second platform, an end of the second platform being connected to the first bent portion, and the second platform pivoting relative to the first platform via the first bent portion;
    an engaging portion disposed on a side of the second platform, the engaging portion being for engaging with an interface card and the casing as the second platform pivots relative to the first platform, so as to fix the interface card on the casing; and
    a pressing portion disposed on the side of the second platform for pressing the interface card as the engaging portion engages with the interface card and the casing.

2. The fixing mechanism of claim 1, further comprising a fixing portion connected to a bottom of the first platform, and the fixing portion being for fixing the first platform on the casing of the electronic device.

3. The fixing mechanism of claim 2, wherein the fixing portion comprises two hooking components respectively disposed on two sides of the bottom of the first platform, and the two hooking components are for engaging with two holes on the casing.

4. The fixing mechanism of claim 2, wherein the fixing portion and the first platform are integrally formed.

5. The fixing mechanism of claim 1, further comprising:
    a second bent portion connected to another end of the second platform; and
    a handle portion connected to the second bent portion, the handle portion pivoting relative to the second platform via the second bent portion.

6. The fixing mechanism of claim 5, wherein the first platform, the second platform, the first bent portion, the second bent portion, the engaging portion and the handle portion are integrally formed and made of resilient material.

7. The fixing mechanism of claim 5, wherein a guiding structure is formed on the engaging portion for guiding the engaging portion to engage with an opening of the interface card and an installing hole of the casing.

8. The fixing mechanism of claim 7, wherein a slot is formed on the engaging portion so that the engaging portion is deformed as being pressed inward by the opening and the installing hole when the engaging portion passes through the opening of the interface card and the installing hole of the casing.

9. The fixing mechanism of claim 8, wherein a maximum outer diameter of the engaging portion is greater than a diameter of the installing hole or a diameter of the opening, and the engaging portion is made of resilient material.

10. An electronic device, comprising:
    a casing; and
    a fixing mechanism for fixing an interface card on the casing, the fixing mechanism comprising:
        a first platform fixed on the casing of the electronic device;
        a first bent portion connected to the first platform;
        a second platform, an end of the second platform being connected to the first bent portion, and the second platform pivoting relative to the first platform via the first bent portion;
        an engaging portion disposed on a side of the second platform, the engaging portion being for engaging with the interface card and the casing as the second platform pivots relative to the first platform, so as to fix the interface card on the casing; and
        a pressing portion disposed on the side of the second platform for pressing the interface card as the engaging portion engages with the interface card and the casing.

11. The electronic device of claim 10, further comprising a fixing portion connected to a bottom of the first platform, and the fixing portion being for fixing the first platform on the casing of the electronic device.

12. The electronic device of claim 11, wherein the fixing portion comprises two hooking components respectively disposed on two sides of the bottom of the first platform, and the two hooking components are for engaging with two holes on the casing.

13. The electronic device of claim 11, wherein the fixing portion and the first platform are integrally formed.

14. The electronic device of claim 10, further comprising:
    a second bent portion connected to another end of the second platform; and
    a handle portion connected to the second bent portion, the handle portion pivoting relative to the second platform via the second bent portion.

15. The electronic device of claim 14, wherein the first platform, the second platform, the first bent portion, the second bent portion, the engaging portion and the handle portion are integrally formed and made of resilient material.

16. The electronic device of claim 14, wherein a guiding structure is formed on the engaging portion for guiding the engaging portion to engage with an opening of the interface card and an installing hole of the casing.

17. The electronic device of claim 16, wherein a slot is formed on the engaging portion so that the engaging portion is deformed as being pressed inward by the opening and the installing hole when the engaging portion passes through the opening of the interface card and the installing hole of the casing.

18. The electronic device of claim 17, wherein a maximum outer diameter of the engaging portion is greater than a diameter of the installing hole or a diameter of the opening, and the engaging portion is made of resilient material.

19. An electronic device, comprising:
- a casing, an installing hole being formed on the casing; and
- a fixing mechanism for fixing an interface card on the casing, the fixing mechanism comprising:
    - a first platform fixed on the casing of the electronic device;
    - a first bent portion connected to the first platform;
    - a second platform, an end of the second platform being connected to the first bent portion, and the second platform pivoting relative to the first platform via the first bent portion; and
    - an engaging portion disposed on a side of the second platform, the engaging portion being for engaging with an opening of the interface card and the installing hole of the casing as the second platform pivots relative to the first platform, so as to fix the interface card on the casing.

* * * * *